US005457065A

United States Patent [19]
Huang et al.

[11] Patent Number: 5,457,065
[45] Date of Patent: Oct. 10, 1995

[54] METHOD OF MANUFACTURING A NEW DRAM CAPACITOR STRUCTURE HAVING INCREASED CAPACITANCE

[75] Inventors: Cheng H. Huang, Hsin-chu; Water Lur, Taipei, both of Taiwan

[73] Assignee: United Microelectronics Corporation, Hsinchu, Taiwan

[21] Appl. No.: 355,490

[22] Filed: Dec. 14, 1994

[51] Int. Cl.⁶ ................................................ H01L 21/8242
[52] U.S. Cl. .......................... 437/60; 437/191; 437/919
[58] Field of Search ............................ 437/60, 191, 919, 437/978; 148/DIG. 14

[56] References Cited

U.S. PATENT DOCUMENTS

| | | | |
|---|---|---|---|
| 5,006,481 | 4/1991 | Chan et al. | 437/919 |
| 5,059,548 | 10/1991 | Kim | 437/60 |
| 5,102,820 | 4/1992 | Chiba | 437/52 |
| 5,164,337 | 11/1992 | Ogawa et al. | 437/228 |
| 5,223,729 | 6/1993 | Kudoh et al. | 257/296 |
| 5,266,514 | 11/1993 | Tuan et al. | 437/52 |
| 5,270,238 | 12/1993 | Kim | 437/60 |

FOREIGN PATENT DOCUMENTS

| | | | |
|---|---|---|---|
| 3-35554 | 2/1991 | Japan | 437/919 |

OTHER PUBLICATIONS

"A newly Designed Planar Stacked Capacitor Cell With High Dielectric Constant Film for 256 Mbit DRAM" by T. Eimori et al, IEEE International Electron Device Meeting Proceedings, Dec. 1993, pp. 631–634.

Primary Examiner—Chandra Chaudhari
Attorney, Agent, or Firm—George O. Saile

[57] ABSTRACT

A method for fabricating a stacked storage capacitor on a dynamic random access memory (DRAM) cell with increased capacitance was accomplished. The stacked capacitor is used with a field effect transistor (FET) as part of a dynamic random access memory (DRAM) cell for storing data in the form of stored charge on the capacitor. The method for making the capacitor involves forming a bottom electrode from a single polysilicon layer having a fin-shaped structure, and then using a second polysilicon layer and a plasma etch back to create a second self-aligned fin-like structure that significantly increases the surface area of the capacitor bottom electrode. The capacitor structure is then completed by forming a thin capacitor dielectric layer on the bottom electrode and depositing a third polysilicon layer to form the top electrode and complete the capacitor with significantly increased capacitance and an economy of processing steps.

28 Claims, 6 Drawing Sheets

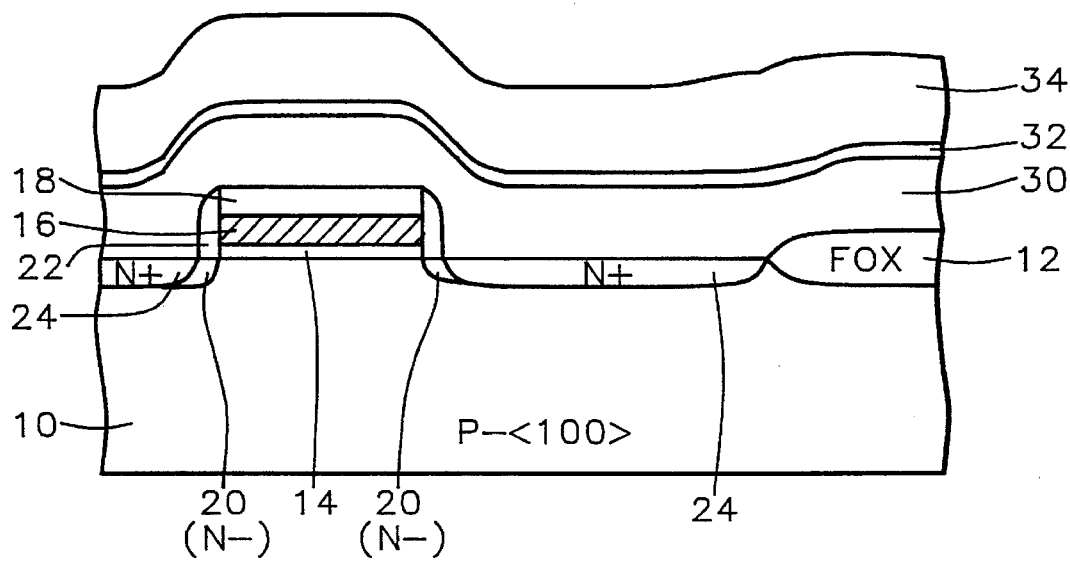
FIG. 1 - Prior Art
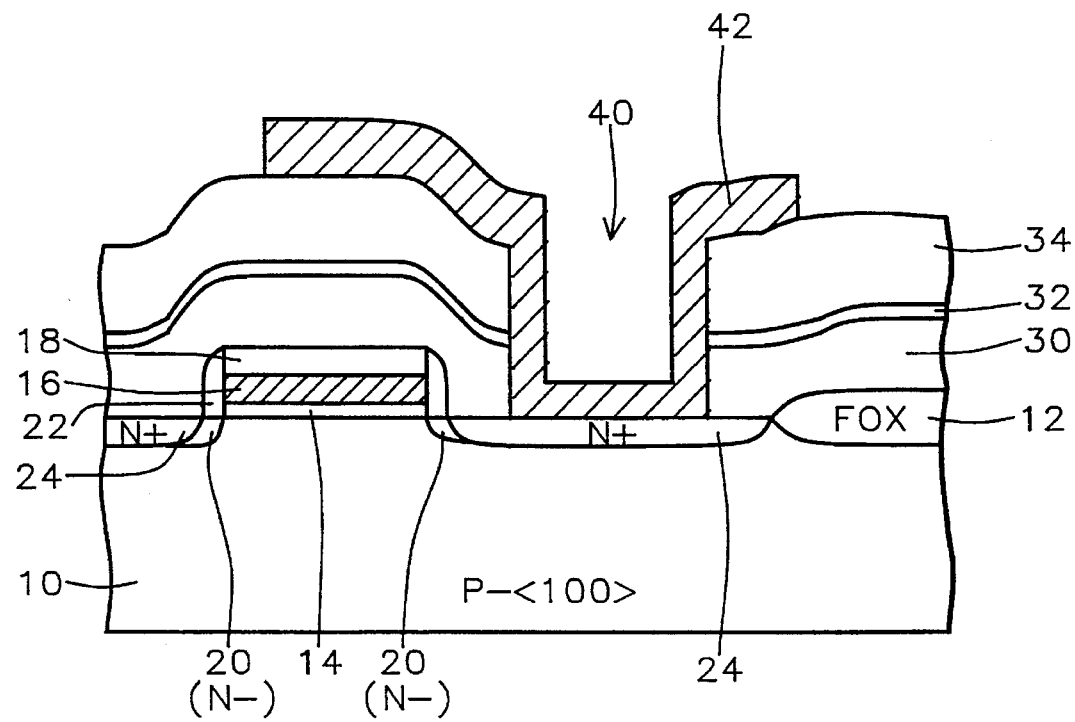
FIG. 2 - Prior Art

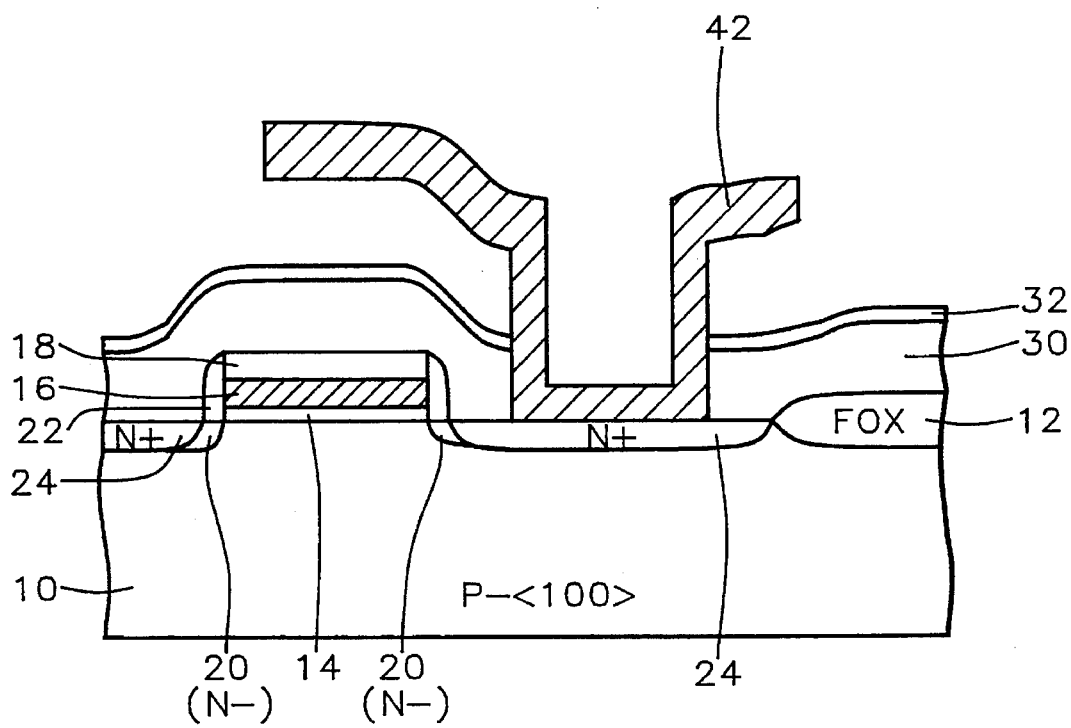
FIG. 3 – Prior Art
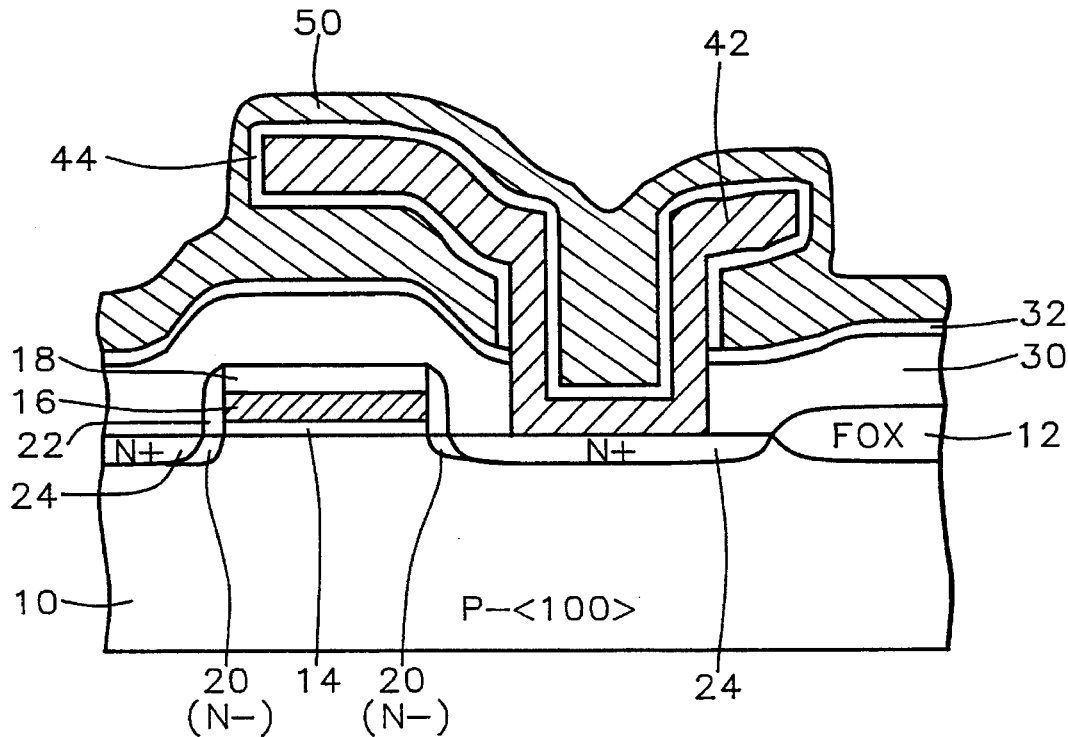
FIG. 4 – Prior Art

METHOD OF MANUFACTURING A NEW DRAM CAPACITOR STRUCTURE HAVING INCREASED CAPACITANCE

BACKGROUND OF THE INVENTION

1. Field of the Invention

This invention relates to a Random Access Memory (RAM) device and more particularly, a method for fabricating a Dynamic Random Access Memory (DRAM) device having a stacked storage capacitor with increased capacitance.

2. Description of the Prior Art

Advances in semiconductor technologies have dramatically increased the circuit density on a chip. For example, advances in photolithographic techniques, such as phase-shifting masks, self-aligning process steps and directional plasma etching have further reduced the device size and increased circuit density. This has lead to Ultra Large Scale Integration (ULSI) on semiconductor substrates with minimum device dimensions less than a micrometer and more than a million transistors formed on a chip cut (diced) from the substrate. With this improved integration, some circuit elements experience electrical limitation due to their down sizing.

One type of circuit elements experiencing electrical limitations is the array of storage cells formed on a Dynamic Random Access Memory (DRAM) chip. These DRAM devices having arrays of storage cells, each cell consisting of a single field effect transistor (FET) and a single capacitor are used extensively in the electronic industry, and particularly in the computer industry, for storing data. The individual DRAM cell stores a bit of data on a capacitor as electrical charge.

With increasing circuit density, the array of cells on the DRAM chip increase in number and the individual capacitors decreases in size. This makes it more difficult to maintain sufficient charge on the capacitor to achieve acceptable signal-to-noise level. Also, because of leakage currents, these volatile storage cells require more frequent refresh cycles to maintain their charge level.

The storage capacitors are either formed in the substrate, usually referred to as trench capacitor, or are formed on the substrate over the field effect transistor and are usually referred to as stacked capacitors. The latter approach has received considerable attention in recent years because of the flexibility in fabricating the capacitor during processing. However, since each stacked capacitor, in the array of cells, are confined within the cell area, it is difficult to maintain sufficient capacitance as the cell density increases and the cell size decreases. As conventional methods of high resolution photolithography and anisotropic etching reach their limits, it becomes necessary to explore other methods for increasing the capacitance.

One method of increasing the capacitance is to roughen the surface of the bottom electrode of the capacitor to effectively increase the surface area without increasing its overall size. See, for example, H. C. Tuan et.al. U.S. Pat. No. 5,266,514. Another approach is to use an interelectrode insulator having a high dielectric constant. See for example, "A Newly Designed Planar Stacked Capacitor Cell with High Dielectric Constant Film for 256 Mbit DRAM" by T. Eimori et al, IEEE International Electronic Device Meeting Proceedings, Dec 1993 page 631–634.

Still another approach is to build three dimensional capacitor structure extending vertically upward over and within the cell area. For example, A. Chiba, U.S. Pat. No. 5,102,820, uses a patterned multilayer of polysilicon and silicon oxide with polysilicon sidewall to make a vertical capacitor with a cavity formed therein to increase the surface area of the capacitor. Another approach is described by H. Ogawa et al, U.S. Pat. No. 5,164,337 having a similar structure as U.S. Pat. No. 5,102,820, but made by forming a multi-layer insulating template and then depositing a conformal polysilicon layer thereon to form a capacitor with increased area. And yet another approach is described by C. Kudoh et al, U.S. Pat. No. 5,223,729 in which a multilayer of polysilicon and silicon oxide are patterned and the oxide is removed forming a fin-shaped capacitor.

However, many of these methods require etching a contact opening having vertical sidewalls through a multilayer of polysilicon and oxide which is difficult to achieve. Other methods rely on forming sidewall polysilicon structures to form a continuous capacitor electrode, which is also difficult to manufacture. In general, much of the prior art mentioned above require significantly more processing steps which increase manufacturing cost and reduce process yields.

A relatively simple prior art DRAM process for increasing the cell capacitance is now described with reference to the schematic cross sections shown in FIGS. 1 through 4, so as to better understand the nature of the problem solved. Referring to FIG. 1, a substrate 10 is provided, such as P⁻ doped single crystal silicon, having device areas surrounded and electrically isolated by a Field OXide (FOX) 12. Only one cell area of the array of cells fabricated simultaneously on the substrate is depicted in the Figs. A gate oxide layer 14, for the FET, is formed on the device area and then word lines, patterned from a N doped conductive polysilicon layer 16 are formed having portions over the gate oxide 14 serving as FET gate electrodes 16. Usually an insulating layer 18 is formed over the gate electrode 16 at the same time the electrode is formed. For very short channel FETs, it is common practice in the semiconductor industry, to form lightly doped drain (LDD) FETs to improve the electrical characteristics of the FET. This is accomplished by implanting an N-type dopant at low dose in the source/drain areas 20 adjacent to the gate electrode 16 and then protecting the LDD region by forming a insulating sidewall spacer 22 using an anisotropically etch back of an insulating layer, such as $SiO_2$. A high dose N-type implant is then carried out to form the source/drain regions 24 and complete the LDD FET.

The DRAM stacked capacitor of this prior art having a fin-shaped extension to increase capacitance is then formed by first depositing a multi-layer insulating film composed of a silicon oxide layer 30, a silicon nitride layer 32 and another silicon oxide layer 34. Also shown in FIG. 1. Contact openings 40 (only one shown in FIG. 2) are then etched to one of the two source/drain regions 24 of each FET. The bottom electrode of the stacked capacitor is formed by depositing a polysilicon layer 42, that is also doped N⁺ type, and patterning layer 42 to form the fin-shaped bottom electrode 42 having increased surface area. The silicon oxide layer 34 is now isotropically etched in, for example, a hydrofluoric acid solution removing completely layer 34 and leaving a free standing fin-shaped bottom electrode 42, as shown in FIG. 3. A thin capacitor dielectric 44 is formed on the bottom electrode 42 and a second N+ doped polysilicon layer 50 is deposited to form the top electrode of the capacitor and complete the stacked capacitor storage cell. However, as the cell size decreases with increased packing density, the fin-shaped electrode 42 must also decrease in surface area.

Therefore, there is still a strong need to develop a stacked capacitor process that is as simple as possible, avoids the difficult processing problems, and does not substantially increase the number of process steps while maintaining as large a surface area as possible.

SUMMARY OF THE INVENTION

It is the principal object of the invention to provide a new process for fabricating stacked capacitor structure for producing a DRAM memory cell having increased capacitance.

It is another object of the invention to provide a method for making a single fin-shaped bottom electrode structure and to add an additional polysilicon layer that is then etched back to form a second fin-shaped structure that substantially increases the capacitor area.

It is still another object of the invention to form this storage capacitor with an economy of processing steps to maintain a high yield, good reliability and low cost.

These objectives are achieved by: 1) depositing a doped polysilicon layer, over a previously formed single fin-shaped capacitor electrode, also composed of polysilicon and 2) anisotropically etching back the doped polysilicon layer forming a second fin-shaped structure which is under, self-aligned and connected to the first fin-shaped electrode. The method for fabricating this new dynamic random access memory (DRAM) cell with the improved stacked capacitor is now described.

The fabrication process starts by forming a Field OXide (FOX) on the surface of the semiconducting substrate surrounding and isolating an array of active device regions wherein field effect transistors (FET) are fabricated. A thin gate oxide is grown on the substrate surface in the active device regions. A relatively thick polysilicon layer is deposited over the gate oxide and the field oxide. The polysilicon layers is then patterned to form the gate electrodes of the field effect transistors (FET) in the device regions and conducting polysilicon patterns areas (word lines) elsewhere on the field oxide. Lightly doped source/drain regions are then formed adjacent to the gate electrodes in the active device regions. Insulating sidewall spacers are next formed by depositing an insulating layer and anisotropically etching back the layer to the substrate surface. The source/drain contact areas are then formed by ion implantation of an N-type impurity to complete the field effect transistors.

The high capacitance stacked capacitors, of this invention, are then formed by depositing a multi-layer insulating film, composed of a first, second and third insulating layer. The third layer being the top layer of the multi-layer insulating film. The second insulating layer is composed of a material, such as silicon nitride ($Si_3N_4$), which is different from the first and third insulating layers, composed, for example, of silicon oxide ($SiO_2$). Openings are etched in the multi-layer insulating film to provide node contact openings to the device areas where the stacked capacitors are to make electrical contact. A first polysilicon layer is deposited, for example by chemical vapor deposition (CVD), and doped with an N-type dopant species, such as arsenic (As) or phosphorus (P). The first polysilicon layer is then patterned using conventional photolithographic techniques and plasma etching, leaving portions aligned over the contact openings and forming part of the bottom electrodes of the stacked capacitors. The third insulating layer, composed of $SiO_2$, is then completely removed by subjecting the exposed surface of the third insulating layer between the patterned first polysilicon layer to an isotropic etch, such as a hydrofluoric acid solution. The second insulating layer composed of $Si_3N_4$ functions as an etch stop layer protecting the underlying device structures. The lateral etching of the third insulating layer under the patterned first polysilicon layer results in bottom electrodes having fin-shaped portions extending out from the contact openings.

Now, very important to this invention, a second polysilicon layer is conformally deposited over the patterned first polysilicon layer (bottom electrodes) and elsewhere on the exposed second insulating layer ($Si_3N_4$) and then anisotropically etched back to the $Si_3N_4$ surface, thereby leaving portions of the second polysilicon layer on the sidewalls and also forming a second fin-shaped structure under and aligned to the first fin-shaped extensions of the bottom electrodes, increasing significantly the electrode areas, and thereby resulting in increased capacitance.

The storage capacitors for the DRAM device are now completed by depositing a thin capacitor dielectric layer and a third polysilicon layer as the top electrode.

BRIEF DESCRIPTION OF THE DRAWINGS

The objects and advantages of this invention are best understood by the preferred embodiment with reference to the attached drawings which are now briefly described.

FIGS. 1 through 4 show a schematic cross-sectional view for the process steps of a prior art DRAM cell having a conventional stacked storage capacitor with a single fin-shaped bottom electrode.

DESCRIPTION OF THE PREFERRED EMBODIMENTS

Now in keeping with the objects of this invention, the method for forming a DRAM device having a storage capacitor with increased capacitance is described in detail. The sequence of fabrication steps are shown in FIGS. 5 through 10. The process for forming the Field OXide (FOX) and the field effect transistor (FET) structure, presently practiced in manufacturing DRAM cells, are only briefly described so as to better understand the current invention.

It should also be well understood by one skilled in the art that by including additional process steps, not described in this embodiment, other types of devices can also be included on the DRAM chip. For example, P channel MOSFETs can be formed by providing N-Wells in the P substrate and CMOS circuits can be formed therefrom, such as the peripheral circuits that make up the address decode and output circuits. It should also be understood that the Figs. depict only one DRAM storage cell out of a multitude of cells that are fabricated simultaneously on the substrate.

Figure 5:
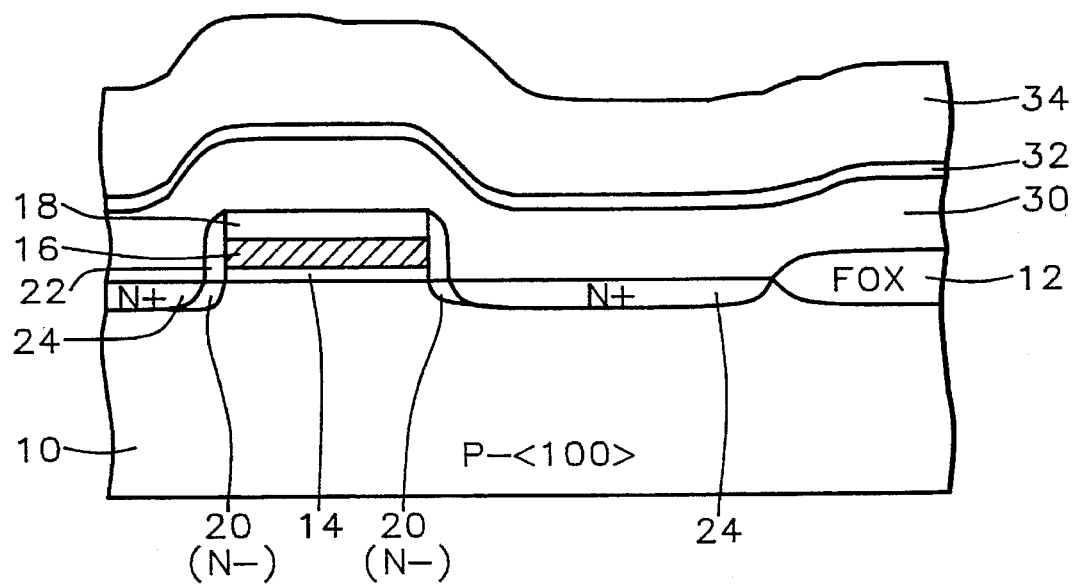
FIGS. 5 through 11 show the cross-sectional view for the process steps of the improved DRAM cell, of this invention, with the stacked storage capacitor having increased capacitance.

Referring now to FIG. 5, a schematic cross-sectional view of the substrate 10 having a partially completed DRAM cell formed on and in the substrate surface, is shown. The preferred substrate is composed of a P-type single crystal silicon having a (100) crystallographic orientation. A relatively thick Field OXide (FOX) 12 is formed around the active device areas to electrically isolate these areas. This field oxide, only partially shown in FIG. 5, is formed by masking the active device areas with a thin silicon oxide (pad oxide) and a thicker silicon nitride layer which forms an oxidation barrier. The silicon substrate is then oxidized in an oxidizing ambient to form the field oxide. The preferred thickness being in the range of about 3000 to 6000 Angstroms.

The semiconductor device is then formed in the active device area after removing the silicon nitride barrier layer and the pad oxide in a conventional wet etch. The most commonly used device for dynamic random access memory is the Field Effect Transistor (FET) having an insulated gate. This device is formed by first thermally oxidizing the active device area to form a thin gate oxide 14. The preferred thickness being from about 30 to 300 Angstroms. An appropriately doped polysilicon layer 16 and an insulating layer 18 are deposited on substrate 10 and conventional photolithographic techniques and plasma etching are used to pattern the insulating layer 18 and the polysilicon layer 16. This forms the gate electrode 16 of the FET in the active device areas and conducting patterns elsewhere on the substrate having an insulating layer 18 thereon. Portions of these electrically conducting polysilicon patterns form the word lines that electrically connect the FET gate electrode to the appropriate peripheral circuits on the DRAM chip. The lightly doped source/drain 20 of the N-channel MOSFET is formed next, usually by implanting a N-type atomic species such as arsenic or phosphorus. For example a typical implant might consist of phosphorus $P^{31}$ at a dose of between 1 and 10 E 13 atoms/cm$^2$ and at an energy between about 30 to 80 Kev.

After forming the lightly doped source/drain, sidewall spacers 22 are formed on the polysilicon gate electrode sidewalls. These sidewall spacers are formed by depositing a low temperature silicon oxide and anisotropically etching back to the silicon surface. For example, the silicon oxide could be a chemical vapor deposition using tetraethoxysilane (TEOS) at a temperature in the range of about 350° to 900° C. and the etch back performed in a low pressure reactive ion etcher.

The source/drain region areas 24 of the MOSFET are now implanted with a N type atomic species, for example, arsenic ($As^{75}$), to complete the source/drain regions 24. The implantation is usually done through a thin layer of silicon oxide of about 50 to 300 Angstroms in thickness, to minimize implant channeling and to protect against contamination by metals and other impurities. A typical implantation dose being between about 2 E 14 to 1 E 16 atoms/cm$^2$ and an energy of between about 20 to 100 Kev.

The remainder of this embodiment relates more specifically to the objects of the invention, which relate to the formation of the stacked capacitor having increased capacitance. The new capacitor structure is formed using two polysilicon layers for the bottom electrode. Although the Figs. depict contact openings that are not self-aligned to the source/drain 24, it should be understood by one skilled in the art that these storage capacitors can also be formed on self-aligned source/drain contacts, further reducing the cell size and increasing the DRAM cell density.

Still referring to FIG. 5, a multi-layer insulating film comprising of a first 30, second 32 and a third 34 insulating layer is deposited on the substrate 10, over the active device areas having FETs and source/drain areas formed therein and also over the thick field oxide 12 elsewhere on the substrate 10. The preferred composition of the first insulating layer 30 is a low temperature silicon oxide, such as the chemical vapor deposited (CVD) using a reactant gas containing tetraethoxysilane (TEOS) and the preferred thickness is between about 800 to 4000 Angstroms. The second insulating layer 32 provides the important function as an etch stop layer, as will become apparent later in the process description. The preferred composition of the second insulating layer 32 is silicon nitride ($Si_3N_4$) and the preferred thickness of layer 32 is between about 100 to 500 Angstroms. The formation of the silicon nitride layer can be accomplished by a Low Pressure Chemical Vapor Deposition (LPCVD) by the reaction, for example, of dichlorsilane ($SiCl_2H_2$) and ammonia ($NH_3$) at a temperature in the range between about 700° to 800° C. The silicon nitride layer 32 also serves as an excellent barrier to sodium ion diffusion which can degrade the electrical characteristics of the circuit. The third insulating layer 34 deposited on layer 32 is also, preferably silicon oxide and is also deposited by CVD using a reactant gas containing TEOS. The preferred thickness is between about 2000 to 5000 Angstroms.

Figure 6:
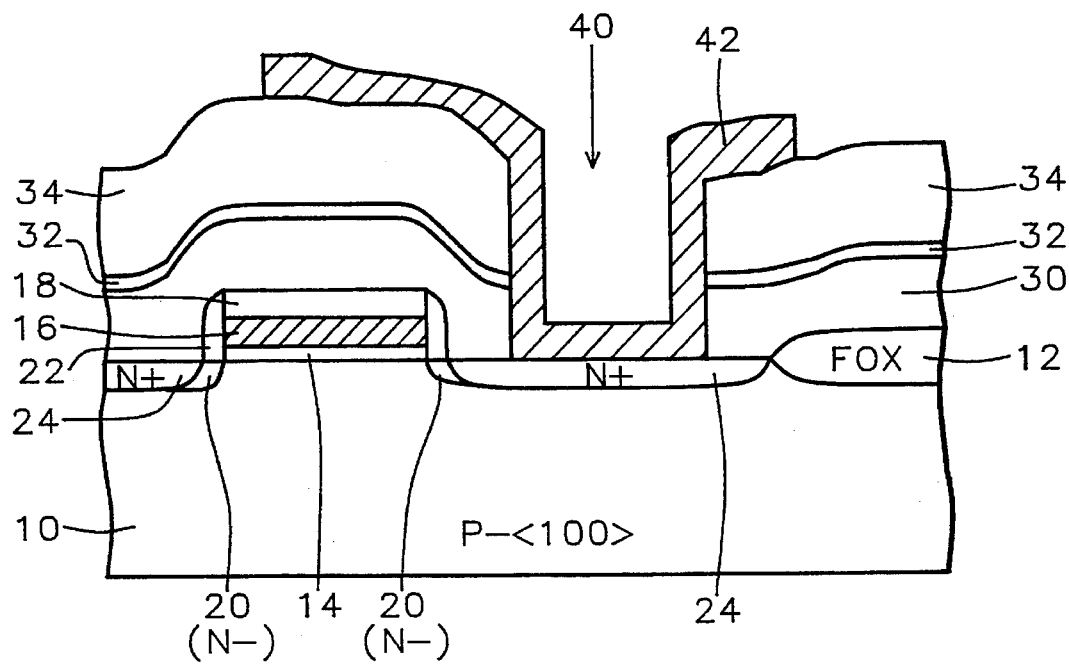

Now as shown in FIG. 6, a contact opening 40 for the capacitor node contact, of the storage capacitor, is selectively formed to one of the two source/drain areas of the FET by etching through the multi-layer insulating film. The contact opening is formed by using conventional photolithographic techniques and etching in a low plasma etcher having a high silicon oxide to silicon etch rate selectivity. For example, a gas mixture of carbon tetrafluoride and hydrogen ($CF_4/H_2$) can be used as the etching gas. The etch rate ratio of $SiO_2$ to Si preferably being greater than about 20 to 1.0.

Still referring to FIG. 6, the bottom electrode of the stacked capacitor is formed by depositing a conformal first polysilicon layer 42. The polysilicon layer 42 is deposited over the third insulating layer 34 and in the node contact opening 40 forming the capacitor node contact to source/drain contact 24. The preferred thickness of this layer is between about 1000 to 5000 Angstroms. The process of choice for depositing the layer is in a low pressure chemical vapor deposition (LPCVD) reactor and at a temperature between about 450° to 650° C. The polysilicon layer 42 is then doped with an N-type dopant, such as by implanting arsenic or phosphorus ion. The preferred dopant concentration is between about 5 E 19 to 1 E 21 atoms/cm$^3$. Alternatively, the polysilicon layer 42 can be doped in situ during the polysilicon deposition, for example, by adding dopant gases such as phosphine ($PH_3$) to the CVD reactant gases ($SiH_4$ or $SiCl_2H_2$).

The first polysilicon layer 42 is then patterned using conventional photolithographic techniques and anisotropic plasma etching to form part of the bottom electrode of this invention. The patterned layer 42 is also shown in FIG. 6 (the photoresist mask not shown) after the etching is complete, exposing the third insulating layer 34 between the electrodes and after the photoresist mask is removed. Layer 42 is preferably etched in a plasma etcher, such as a Reactive Ion Etcher (RIE) and in a etch gas with a high etch rate selectivity of polysilicon to silicon oxide. A gas mixture containing a chlorine etching species, such as $Cl_2$ or $CCl_2F_2$ in an argon (Ar) carrier gas can be used. However, over etching at this process step is not critical since the underlying thick oxide layer 34 is later removed in the process.

Figure 7:
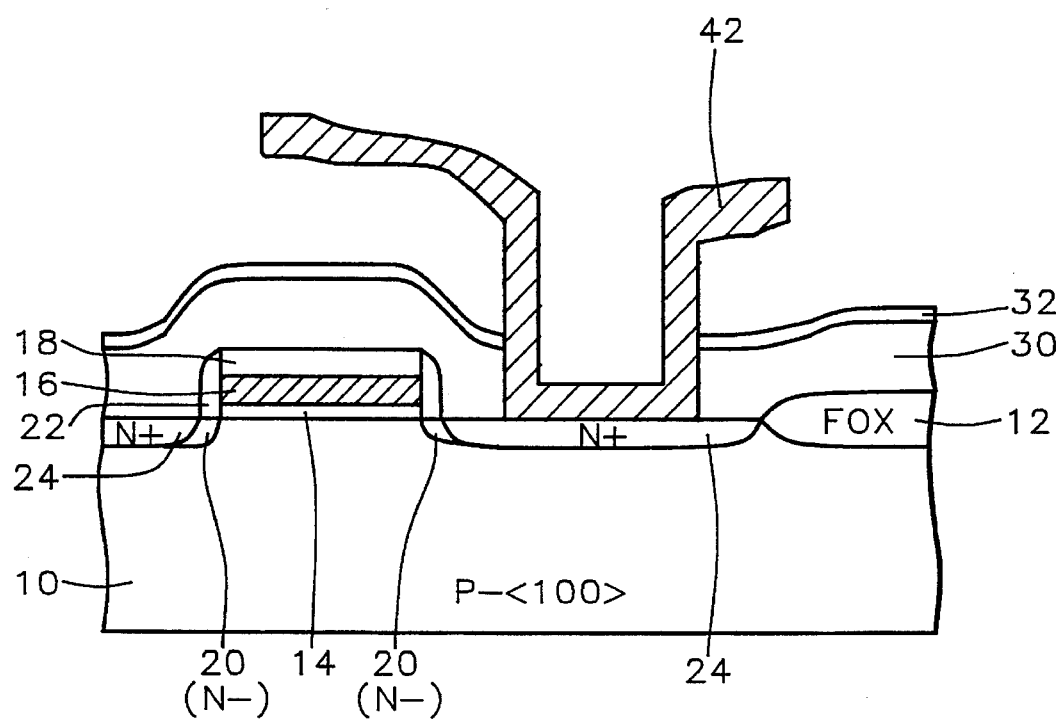

Referring now to FIG. 7, the third insulating layer 34 is completely removed by isotropic etching, such as by immersing the substrate in an aqueous solution of hydrofluoric acid. The second insulating layer 32 composed of $Si_3N_4$ provide an important process function as an etch stop layer protecting the device structure and the first insulating layer 30 thereunder.

After removal of layer 34, the bottom electrode composed of the polysilicon layer 42 is a free standing structure having fin-shaped portions extending outward over the storage cell area, as shown in FIG. 7 and thereby increasing the surface area of the capacitor. However, as the packing density of the cells increases and the storage cell area decreases, the capacitor area will likewise decrease. The importance of this invention is to further increase the electrode area of the single fin structure by incorporating a second polysilicon layer in a simple process that forms a second fin-shaped extension to the bottom electrode while adding only two more processing steps to the manufacturing process.

Figure 8:
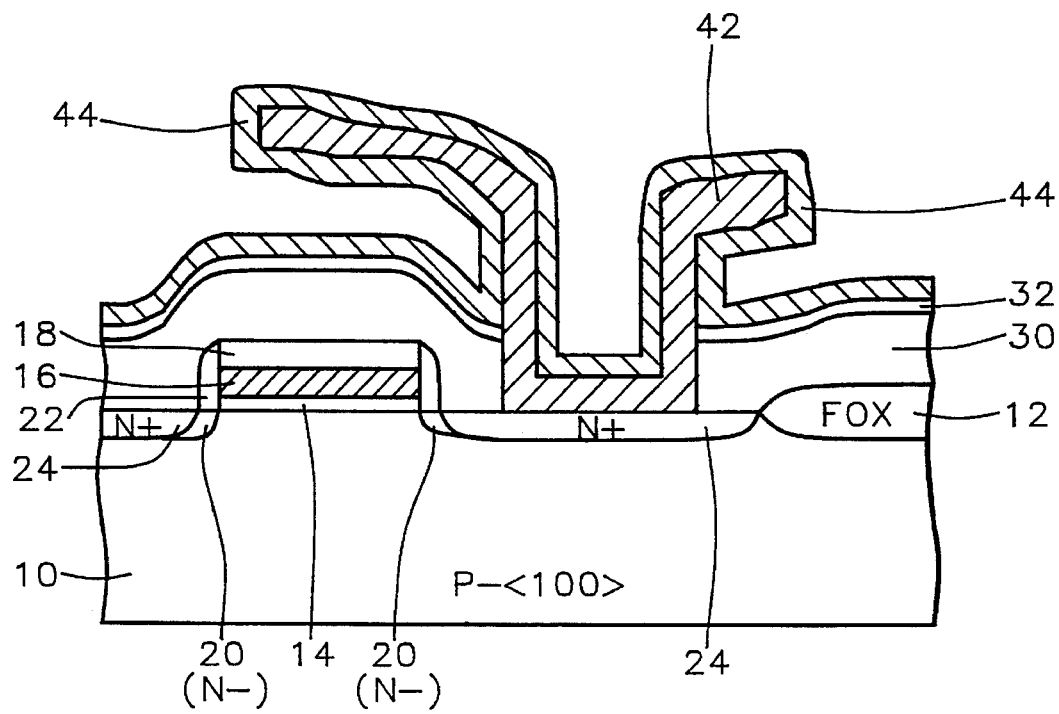

Referring now to FIG. 8, a second polysilicon layer 44 is deposited on the substrate conformally coating the portion of the bottom electrode formed from the first polysilicon layer 42 and also coating the exposed surface of the second insulating layer 32 under the fin-shaped extensions of layer 42, as shown in FIG. 8. The preferred deposition is by using a low pressure chemical deposition (LPCVD) similar to the deposition of the first polysilicon layer 42. However, to uniformly dope layer 44 in the recesses under the fin-shaped structures, the preferred doping is done in situ during the CVD deposition by adding a dopant gas, such as phosphine. The preferred dopant is phosphorus having a concentration of between about $5 E 19$ to $1 E 21$ atoms/cm$^3$ and the preferred thickness of layer 44 is between about 500 to 1500 Angstroms.

Figure 9:
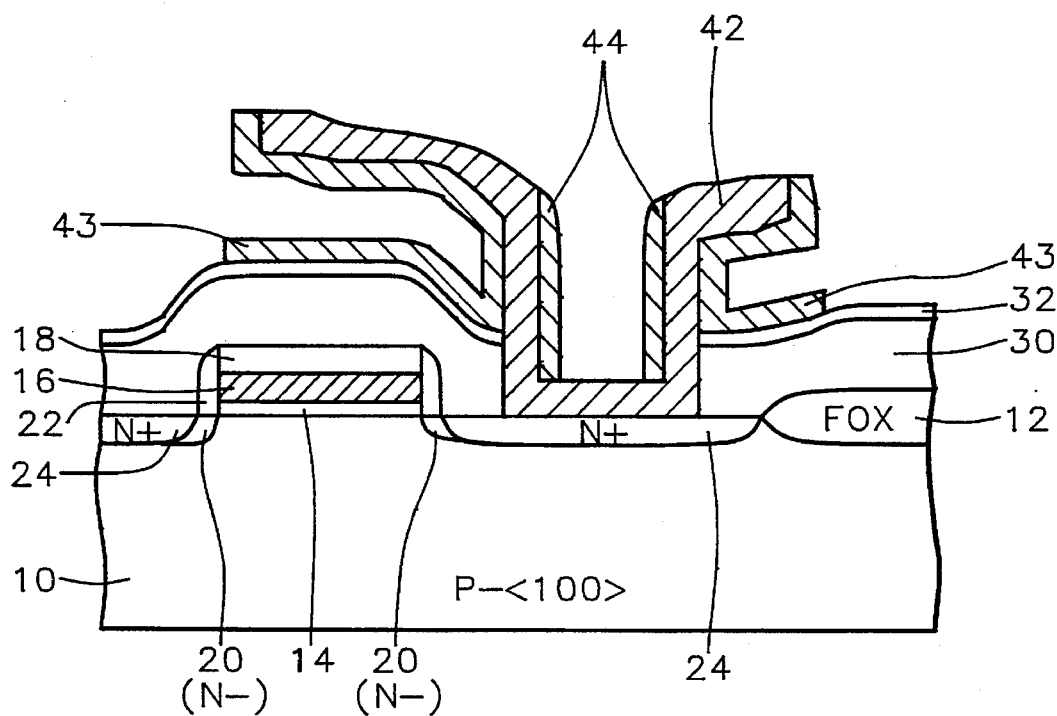

Referring to FIG. 9, the second polysilicon layer 44 is now blanket etched back using an anisotropic plasma etch. For example, as described previously, a reactive ion etcher (RIE) having an etch gas containing, for example, a chlorine species can be used. Also, because the fin-shaped structure of the patterned layer 42 (bottom electrode) functions as an etch mask during the anisotropic etching of layer 44, the portion of the second polysilicon layer 44 remains on the sidewalls of the bottom electrode 42 and more importantly remains on the silicon nitride layer 32 under the fin-shaped structure. This results in an additional or second fin-shaped structure 43, as shown in FIG. 9, formed from a portion of layer 44 that is under and self-aligned to the first or top fin-shaped structure composed of both layers 42 and 44. The method of this invention, therefore, significantly increases the bottom electrode area and therefore also the capacitance of the storage capacitor.

Figure 10:
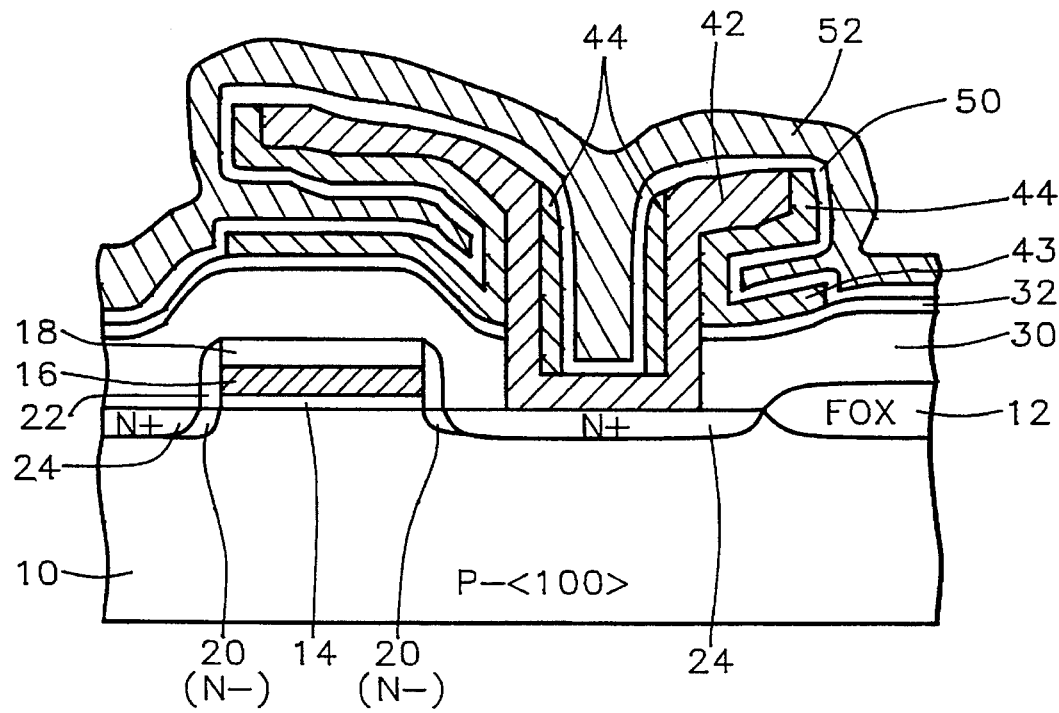

Referring to FIG. 10, the storage capacitor is completed by depositing a dielectric layer 50 having a high dielectric constant and then depositing a third polysilicon layer 52 to form the top capacitor electrode and complete the storage capacitor of the DRAM cell.

The material of the dielectric layer can be any suitable material having a high dielectric constant and being continuous and pin hole free. The preferred dielectric layer 50 is a silicon oxide—silicon nitride—silicon oxide (ONO) layer having a total thickness in the range between about 50 to 200 Angstroms. Alternatively, other high dielectric constant materials can be used. For example, tantalum pentoxide and suitable combinations thereof.

Still referring to FIG. 10, the third polysilicon layer 52 is deposited over the dielectric layer 50 and conventional photolithographic techniques and anisotropic etching are used to suitably pattern the layer and form the top capacitor electrode 52. The preferred thickness of the third polysilicon layer 52 is between about 1000 to 3000 Angstroms. The preferred deposition technique is performed in a LPCVD reactor at a temperature in the range of between about 450° to 650° C.

Figure 11:
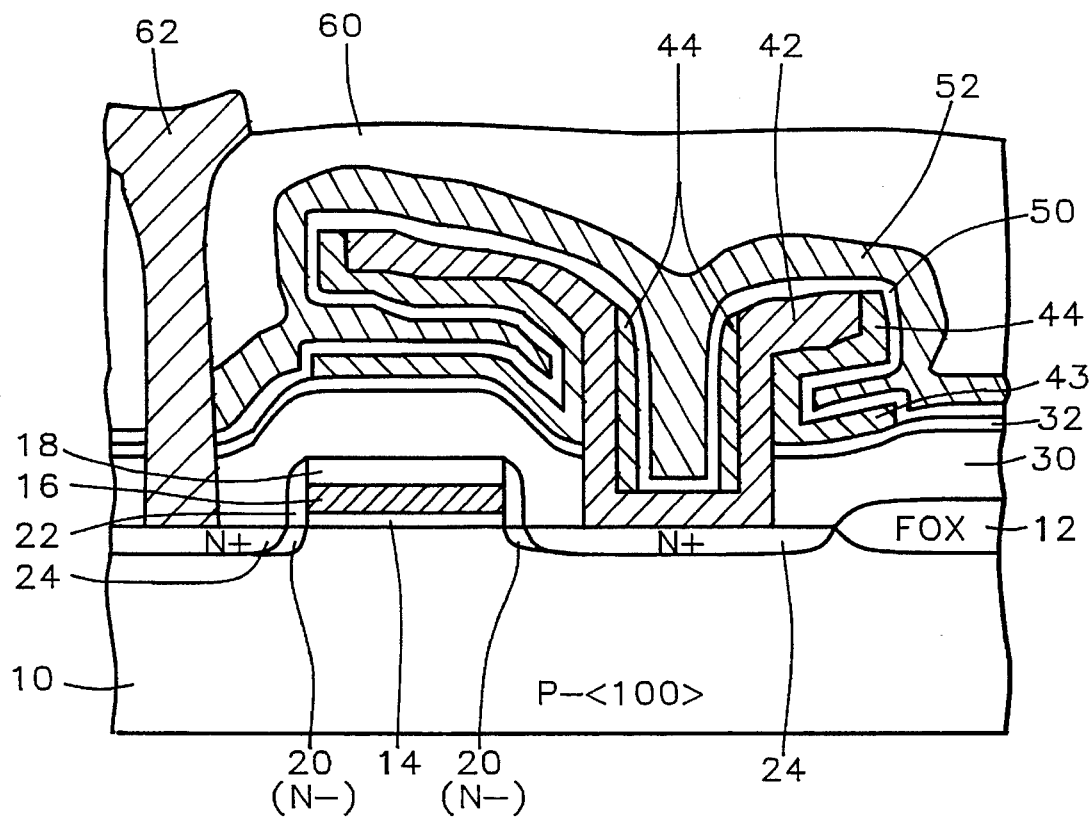

Referring now to FIG. 11, a cross sectional view of a single completed DRAM cell of an array of cells is shown. A second insulating layer 60 is deposited over the DRAM cell. The preferred second insulating layer 60 is composed of two insulating materials, an undoped silicon oxide layer deposited by atmospheric pressure chemical vapor deposition (APCVD) and having a thickness of between about 500 to 1500 Angstroms followed by a low flow temperature glass composed of borophosphosilicate glass (BPSG) having a thickness in the range of about 3000 to 8000 Angstroms. The BPSG is then annealed to planarize the surface. The bit line contact mask and an appropriate photolithographic techniques and etching are used to open the bit line contact in the insulating layer 60, the second insulating layer 32 and the first insulating layer 30 to the second of the two source/drain regions 24 of the FET. A fourth polysilicon layer 62 is deposited and doped with an N-type dopant to form the bit line metallurgy. Alternatively, a silicide layer (not shown) can be formed on the fourth polysilicon layer 62 to increase the conductivity. The preferred method being the deposition of a thin metal layer followed by a low temperature anneal to form the silicide. The preferred metal silicide being tungsten silicide ($WSi_x$). The polysilicon/silicide bit line wiring is then formed using a photolithographic process and a reactive ion etch process to complete the DRAM storage cell with the improved stacked capacitor.

While the invention has been particularly shown and described with reference to the preferred embodiments thereof, it should be understood by those skilled in the art that various changes in form and details may be made without departing from the spirit and scope of the invention. For example, technique for roughening the bottom electrode surface prior to forming the capacitor dielectric layer 50 can be performed to further increase the capacitance of the stacked capacitor.

What is claimed is:

1. A method for fabricating a stacked capacitor on a semiconductor substrate having a field oxide area and a device area formed thereon comprising the steps of;

depositing a multilayer film comprising of a first, a second and a third insulating layer, and said second insulating layer made of a different kind of material than said first and third insulating layers;

forming an opening in said multilayer film to said device area, and thereby providing a contact opening for a bottom capacitor electrode of said stacked capacitor;

depositing conformally a first polysilicon layer on said third insulating layer and in said contact opening thereby making electrical contact to said device area;

masking and patterning said first polysilicon layer leaving portions aligned to said contact opening and extending over said third insulating layer, and thereby forming a portion of the bottom capacitor electrode of said stacked capacitor;

removing completely by isotropic etching said third insulating layer over said second insulating layer, said second insulating layer providing an etch stop layer and thereby forming from said patterned first polysilicon layer a fin-shaped bottom electrode structure for said stacked capacitor;

depositing conformally a second polysilicon layer on said patterned first polysilicon layer and on said second insulating layer;

etching anisotropically said second polysilicon layer, leaving portions of said second polysilicon layer under and on sides of said fin-shaped bottom electrode structure, and on said second insulating layer, thereby forming said bottom capacitor electrode;

depositing conformally a capacitor dielectric layer over said bottom capacitor electrode and on said second insulating layer; and depositing a conformal third polysilicon layer over said capacitor dielectric layer;

patterning said third polysilicon layer thereby forming a top capacitor electrode of said stacked capacitor.

2. The method of claim 1, wherein said first and third insulating layers are composed of silicon oxide ($SiO_2$) deposited by chemical vapor deposition (CVD).

3. The method of claim 2, wherein the thickness of said first insulating layer is between about 800 to 4000 Angstroms.

4. The method of claim 2, wherein the thickness of said third insulating layer is between about 2000 to 5000 Angstroms.

5. The method of claim 1, wherein said second insulating layer is composed of silicon nitride ($Si_3N_4$) deposited by chemical vapor deposition.

6. The method of claim 5, wherein the thickness of said silicon nitride layer is between about 100 to 500 Angstroms.

7. The method of claim 1, wherein said first polysilicon layer is deposited by chemical vapor deposition (CVD) having a thickness of between about 1000 to 5000 Angstroms.

8. The method of claim 7, wherein said first polysilicon layer is doped with N type impurities having a concentration of between about 5 E 19 to 1 E 21 atoms/$cm^3$.

9. The method of claim 1, wherein said third insulating layer is isotropically etched in an aqueous solution of hydrofluoric acid (HF).

10. The method of claim 1, wherein said second polysilicon layer is deposited by chemical vapor deposition (CVD) having a thickness of between about 500 to 1500 Angstroms.

11. The method of claim 10, wherein said second polysilicon layer is doped with N type impurities having a concentration of between about 5 E 19 to 1 E 21 atoms/$cm^3$.

12. The method of claim 1, wherein said capacitor dielectric layer is silicon oxide/silicon nitride/silicon oxide.

13. The method of claim 12, wherein the thickness of said capacitor dielectric layer is between about 50 to 200 Angstroms.

14. The method of claim 1, wherein the thickness of said third polysilicon layer is between about 1000 to 3000 Angstroms.

15. A method for fabricating a dynamic random access memory (DRAM) device having an array of stacked capacitors, comprising the steps of:

providing a semiconductor substrate having field oxide areas surrounding and isolating device areas, said device areas having formed therein field effect transistors (FETs) with source/drain regions; and further comprising the steps of making said stacked capacitors by;

depositing a multi-layer film comprising of a first, a second and a third insulating layer, and said second insulating layer made of a different kind of material than said first and third insulating layers;

forming openings in said multi-layer film to one of said source/drain regions of each of said FETs, and thereby providing contact openings for bottom capacitor electrodes of said stacked capacitors;

depositing conformally a first polysilicon layer on said third insulating layer and in said contact openings, and thereby making electrical contact to said one of said source/drain regions;

masking and patterning said first polysilicon layer leaving portions aligned to said contact openings and extending over said third insulating layer, and thereby forming a portion of the bottom capacitor electrodes of said stacked capacitors;

removing completely by isotropic etching said third insulating layer over said second insulating layer, said second insulating layer providing an etch stop layer and thereby forming from said patterned first polysilicon layer fin-shaped bottom electrode structures for said stacked capacitors;

depositing conformally a second polysilicon layer on said patterned first polysilicon layer and on said second insulating layer;

etching anisotropically said second polysilicon layer, leaving portions of said second polysilicon layer under and on sides of said fin-shaped bottom electrode structures, and on said second insulating layer, thereby forming said bottom capacitor electrodes;

depositing conformally a capacitor dielectric layer over said bottom capacitor electrodes and on said second insulating layer; and depositing a conformal third polysilicon layer over said capacitor dielectric layer;

patterning said third polysilicon layer thereby forming top capacitor electrodes of said dynamic random access memory (DRAM) device having an array of stacked capacitors.

16. The method of claim 15, wherein said first and third insulating layers are composed of silicon oxide ($SiO_2$) deposited by chemical vapor deposition (CVD).

17. The method of claim 16, wherein the thickness of said first insulating layer is between about 800 to 4000 Angstroms.

18. The method of claim 16, wherein the thickness of said third insulating layer is between about 2000 to 5000 Angstroms.

19. The method of claim 15, wherein said second insulating layer is composed of silicon nitride ($Si_3N_4$) deposited by chemical vapor deposition.

20. The method of claim 19, wherein the thickness of said silicon nitride layer is between about 100 to 500 Angstroms.

21. The method of claim 15, wherein said first polysilicon layer is deposited by chemical vapor deposition (CVD) having a thickness of between about 1000 to 5000 Angstroms.

22. The method of claim 21, wherein said first polysilicon layer is doped with N type impurities having a concentration of between about 5 E 19 to 1 E 21 atoms/$cm^3$.

23. The method of claim 15, wherein said third insulating layer is isotropically etched in an aqueous solution of hydrofluoric acid (HF).

24. The method of claim 15, wherein said second polysilicon layer is deposited by chemical vapor deposition (CVD) having a thickness of between about 500 to 1500 Angstroms.

25. The method of claim 24, wherein said second polysilicon layer is doped with N type impurities having a concentration of between about 5 E 19 to 1 E 21 atoms/$cm^3$.

26. The method of claim 15, wherein said capacitor dielectric layer is silicon oxide/silicon nitride/silicon oxide.

27. The method of claim 26, wherein the thickness of said capacitor dielectric layer is between about 50 to 200 Angstroms.

28. The method of claim 15, wherein the thickness of said third polysilicon layer is between about 1000 to 3000 Angstroms.

* * * * *